United States Patent [19]

Hara

[11] 3,739,238

[45] June 12, 1973

[54] SEMICONDUCTOR DEVICE WITH A FIELD EFFECT TRANSISTOR

[75] Inventor: Hisashi Hara, Kanagawa, Japan

[73] Assignee: Tokyo Shibaura Electric Co., Ltd., Kawasaki-shi, Japan

[22] Filed: Sept. 22, 1970

[21] Appl. No.: 74,459

[30] Foreign Application Priority Data

Sept. 24, 1969 Japan .......... 44/75231
Sept. 24, 1969 Japan .......... 44/75232
Jan. 14, 1970 Japan .......... 45/3522

[52] U.S. Cl. ..... 317/235 R, 317/235 G, 317/235 T, 317/235 WW
[51] Int. Cl. .......... H01l 19/00
[58] Field of Search .......... 317/235, 234

[56] References Cited

UNITED STATES PATENTS

| | | | |
|---|---|---|---|
| 3,577,043 | 5/1971 | Cook | 317/235 |
| 3,555,374 | 1/1971 | Usuda | 317/235 |
| 3,525,909 | 8/1970 | Eberhard | 317/234 |
| 3,358,197 | 12/1967 | Scarlett | 317/235 |
| 3,484,662 | 12/1969 | Hagon | 317/235 |
| 3,484,309 | 12/1969 | Gilbert | 148/33.5 |
| 3,573,573 | 4/1971 | Moore | 317/235 |

FOREIGN PATENTS OR APPLICATIONS

| | | | |
|---|---|---|---|
| 1,808,661 | 6/1969 | Germany | 317/235 |

*Primary Examiner*—John W. Huckert
*Assistant Examiner*—E. Wojciechowicz
*Attorney*—Kemon, Palmer and Estabrook

[57] ABSTRACT

A semiconductor device includes a common substrate, on the one side of which there are provided an insulated gate field effect transistor and bipolar transistor for protecting the former transistor from the failure. The gate of the former is electrically connected to the emitter of the latter to have the same potential.

1 Claim, 12 Drawing Figures

INVENTOR.
Hisashi Nara
BY
Kemon, Palmer & Estabrook
Attorneys

INVENTOR.

BY.

INVENTOR.
Hisashi Hara
BY
Fenner, Palmer & Estabrook
Attorneys

INVENTOR.

BY

SEMICONDUCTOR DEVICE WITH A FIELD EFFECT TRANSISTOR

The present invention relates to a semiconductor device including an insulated gate field effect transistor IG-FET and more particularly to a semiconductor device provided with an element for elevating the dielectric breakdown voltage of a gate insulator.

With the IG-FET, it is generally desired that there be used as thin a gate insulator as possible in order to display good properties, for example, to elevate mutual conductance. However, under reduction of the thickness of a gate insulator will lead to decreased dielectric breakdown voltage and, where there is applied a high voltage to a gate electrode, such reduction will give rise to the failure of the gate insulator. If the gate insulator has a thickness of 1,000 A. (which enables a considerably high mutual conductance to be obtained), a gate voltage even of less than 100 volts will result in the failure of the gate insulator and in consequence in the failure of an IG-FET involving such gate insulator. Said insulation failure arises not only in the case when a high voltage in excess of the dielectric breakdown voltage (of the gate insulator) is applied, by mistake, to the gate electrode during operation but also where a high voltage caused by friction between the transistor and dielectric materials is induced in the gate electrode during non-operation.

The conventional technique of preventing the aforementioned failure of the gate insulator is, for example, to provide an IG-FET with a diode element on the same substrate and, for example where the IG-FET is of N-channel type, to connect electrically the gate of the IG-FET to the cathode side of the diode. With a semiconductor device of the aforementioned arrangement, the gate voltage is positive to produce an inversion layer on the semiconductor surface between the source and the drain, so that the diode is reverse biased, namely, is in a nonconductive state. Where the positive gate voltage increases, an avalanche phenomenon takes place in the diode and the diode is brought to a conductive state, preventing any higher voltage from being applied to the gate electrode. On the other hand, when a negative voltage is applied to the gate electrode, the protective diode is in conductive state to prevent the gate insulator from the failure.

A semiconductor device prepared by the abovementioned conventional technique is subject to the following drawbacks. If a high negative voltage is applied to the gate electrode either by mistake or by friction, and the protective diode is forward biased, then a large current passes through the diode which is brought most likely into the eventual failure. The reason for the occurrence of such an event is as follows: The aforementioned protective diode is required to be compact and to have a small diode capacitance as possible for a high speed operation of the IG-FET and/or for reduction of the size of an entire circuitry. The forward voltage applied to the diode thus rendered compact (as well as to the gate electrode of the IG-FET simultaneously) causes a large current to flow through the diode, and the said diode will fail to effect fully heat dissipation.

A semiconductor device according to the present invention has an IG-FET element and a bipolar transistor element which are formed on a common substrate. The emitter electrode of the bipolar transistor is so connected to the gate electrode of the IG-FET as to have the same potential as the latter. Accordingly, if, in case the bipolar transistor is made compact to decrease a parasitic capacitance prevailing therein for causing the IG-FET element to be a high speed operation, there is introduced perchance an undesirable high voltage, then the IG-FET element will be saved from failure.

An IG-FET used in the semiconductor device of the present invention may consist of, for example, a P-channel IG-FET having a $P^+NP^+$ or $P^+PP^+$ structure or an N-channel IG-FET having an $N^+PN^+$ or $N^+NN^+$ structure. The bipolar transistor may be of ordinary type, and it is mounted on the substrate in which there is formed the aforesaid IG-FET. Further, if the emitter electrode of the bipolar transistor is electrically connected to the gate electrode of the IG-FET, bipolar transistor may be separated from or contact each other. Depending on the arrangement of both transistors, the substrate may be prepared from either an insulating or semiconductor material.

The present invention can be more fully understood from the following detailed description when taken in connection with reference to the accompanying drawings, in which.

Figure 1:
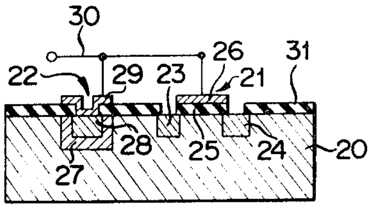
FIG. 1 is a sectional view of a semiconductor device according to an embodiment of the present invention.

There will now be described an embodiment of the present invention with reference to FIG. 1. Reference numeral 20 denotes a semiconductor substrate, on one side of which there are formed an IG-FET element such as an MOS-FET element 21 and a bipolar transistor element 22 at a prescribed interval. The substrate 20 is prepared from P-type silicon, so that the source and drain regions 23 and 24 of the FET element 21 are of an $N^+$-type. That part of the substrate 20 which is defined between the source and drain regions 23 and 24 is covered with an insulation layer 25 consisting of, for example, silicon dioxide, silicon nitride or alumina. On the insulation layer 25 is deposited a gate electrode 26, for example, made of an aluminum or silicon. Thus is prepared the N-channel MOS-FET used in the embodiment of FIG. 1.

On the other hand, the bipolar transistor 22 is of planar structure and has an $N^+$-type base region 27 diffused in the substrate 20 and a P-type emitter region 28 formed therein, thus constituting a PNP type transistor with the substrate 20 itself used as a collector region. To the emitter region 28 is fitted an emitter electrode 29, which is so electrically connected to the gate electrode 26 as to have the same potential as the latter.

From the junction of both electrodes 26 and 29 is led out an input terminal 30. Numeral 31 of FIG. 1 is a protective insulating layer, for example, made of silicon dioxide, silicon nitride or $Al_2O_3$.

There will now be described the operation of a semiconductor device of the aforementioned arrangement. The IG-FET is of N-channel structure, so that in operation a positive voltage is applied to the gate electrode. In this case the emitter-base junction of the protective bipolar transistor 22 is forward biased and the base-collector junction is reverse biased. In a higher positive voltage than the avalanche breakdown voltage of the base-collector junction, the protective transistor converts into conductive state. Accordingly the avalanche phenomenon in the base-collector junction prevents a further higher voltage from being applied to the gate electrode 26 and in consequence prevents the IG-FET from the failure of the gate insulator.

On the other hand, if a negative voltage is applied to the input terminal 30 either by mistake or by friction, the base-collector junction is forward biased and the emitter-base junction is reverse biased. Thus, in this case, the avalanche phenomenon in the emitter-base junction prevents a high voltage from being applied to the gate electrode.

There is found a very important advantage where the bipolar transistor is used for the protection against the dielectric breakdown of the gate insulator in place of the diode used conventionally.

When the diode is used for the protection of the gate insulator, the diode is converted into a conductive state by either positive or negative voltage and a large current flows through the diode, which frequently results in the failure of the diode. Contrary to the case of the diode, the protective bipolar transistor remains in the nonconductive state in spite of the polarity of the voltage applied to the input terminal. Accordingly the protective bipolar transistor is not destroyed by the heat dissipation of the large current and performs protection of the gate insulator from dielectric breakdown satisfactorily.

There will now be described another embodiment of the present invention with reference to FIG. 2. The device comprises an insulating substrate 40 prepared from, for example, sapphire, and a thin bipolar transistor element 41 and thin IG-FET 42, the latter two being formed in said substrate 40 at a prescribed interval. In the bipolar transistor 41 there are arranged in one row an $N^+$-type emitter region 43, P-type base region 44 and $N^+$-type collector region 45. To the emitter region 43 is fitted an emitter electrode 46. The other IG-FET 42 is of N-channel type and comprises a P-type region 47 and source and drain regions 48 and 49 of N-type which are disposed on both sides of said P-type region 47. On the P-type region 47 is mounted a gate electrode 51 through an insulating layer 50. A drain electrode 52 is fitted to the drain region 49 and to the source region 48 is fitted a common electrode 53 which extends to the collector region 45 of the bipolar transistor 41 for connection thereto. The gate and emitter electrodes of the device of FIG. 2 are electrically connected, though not shown, via terminals 54 and 55.

Figure 2:
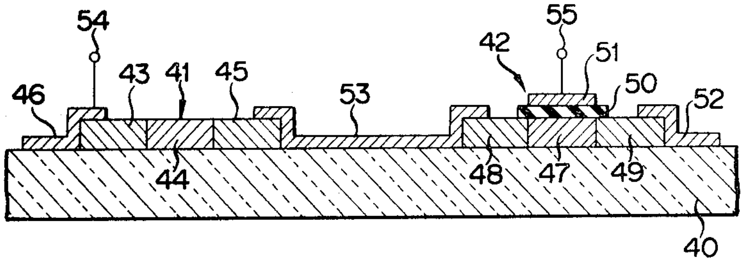
FIGS. 2 to 4 are sectional views of semiconductor devices according to other embodiments of the invention wherein the substrate is formed of an insulating material.
Figure 3:
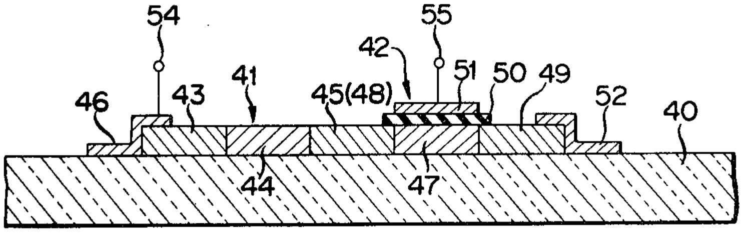
Figure 4:
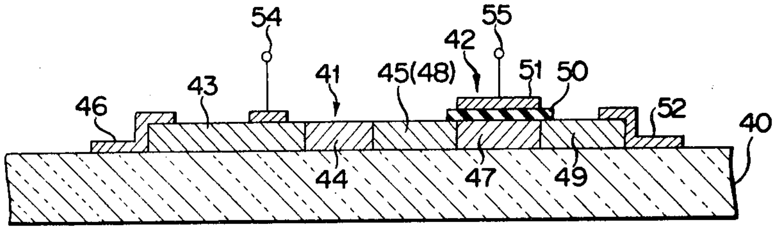

In the embodiment of FIG. 3, the collector and source regions 45, 48 may directly contact each other for electrical connection to eliminate the common electrode interposed therebetween in FIG. 2, or there may be provided a single N-type region concurrently acting as collector and source regions. Further, the terminal 54 may be directly fitted to the emitter region 43 as shown in FIG. 4, instead of being drawn out from the emitter electrode 46.

The thin field effect semiconductor device of FIG. 3 conducts the same fundamental function as that of FIG. 1. In the case of the thin IG-FET of the aforementioned arrangement, the P-type region usually contains relatively low concentrations of impurities, so that the avalanche breakdown voltage in the emitter-base or the base-collector junction may be higher than the dielectric breakdown voltage of the gate insulator and the avalanche phenomenon has no effect on the protection of the gate insulator. In this case, it is possible to utilize the so-called punch-through effect of the protective transistor having an $N^+PN^+$ structure. Namely, where the input voltage increases in a positive direction, the depletion layer of the emitter-base junction of the protective transistor expands toward the collector region and arrives at the base-collector junction, so that said protective transistor becomes conductive. Conversely, where the input voltage increases in a negative direction, the depletion layer of the base-collector junction spreads itself up to the emitter region, thereby allowing the protective transistor to conduct. The aforementioned punch-through voltage $Vp$ is expressed as a function of the length L of the base region of the protective transistor, the thickness D of the gate insulator and the concentration $Na$ of impurities, and by the following equation:

$$Vp=\frac{qNaL}{\pi\epsilon s}\int_0^L \tan^{-1}\left(\frac{D}{2(L-X)}\right)dx$$

Where:

$q$ = elementary charge $\epsilon s$ = dielectric constant of semiconductor material of the abovementioned parameters, the thickness D of the gate insulator and the concentration $Na$ of impurities are determined by the properties demanded of the IG-FET to be used, so that the punch-through voltage $Vp$ can be varied simply by changing the length L of the base region.

Figure 5:
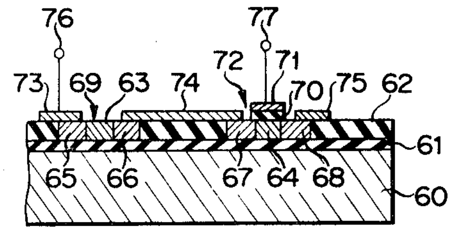
FIG. 5 is a sectional view of a semiconductor device according to still another embodiment of the invention, wherein the substrate consists of a polycrystal material.

The aforementioned thin semiconductor device involved a substrate of sapphire having an electrical insulating property. However, said substrate may be formed of a polycrystal body illustrated in FIG. 5. In this figure, reference numeral 60 represents a substrate consisting of polycrystal silicon having a relatively high resistance. This substrate can be prepared by the epitaxial growth of silicon on a silicon dioxide film 61. On said insulating layer 61 is deposited another silicon dioxide layer 62, in which there are formed openings at a prescribed space. These openings are filled with P-type layers 63 and 64. On both sides of each of these layers 63 and 64 are provided $N^+$-type regions 65, 66, 67 and 68. In one of the openings is disposed a thin bipolar transistor element 69 consisting of the $N^+$-type emitter region 65, P-type base region 63 and $N^+$-type collector region 66, and in the other opening is positioned a thin IG-FET 72 comprising the $N^+$-type source and drain regions 67 and 68, P-type region 64 and a gate electrode 71 provided through a silicon dioxide layer 70 formed on said P-type region 64. Numeral 73 represents an emitter electrode fitted to the emitter region 65, 74 a common electrode to the collector and source regions 66 and 67, and 75 a drain electrode. In the embodiment of FIG. 5 the emitter and gate electrodes 73 and 71 are of course connected together through terminals 76 and 77, performing the same operation as in the preceding embodiments.

Figure 6:
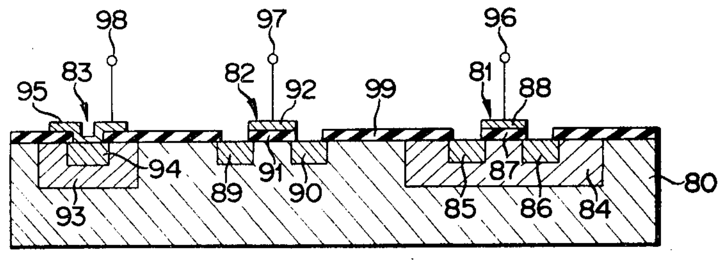
FIG. 6 is a sectional view of a semiconductor device according to a further embodiment of the invention, showing a complementary IG-FET device.
Figure 8:
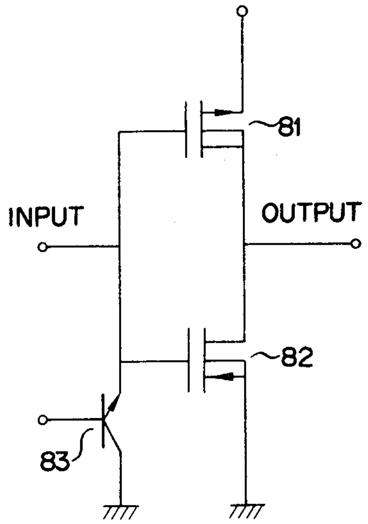
FIG. 8 is an equivalent circuit diagram of the device of FIGS. 6 and 7.

The complementary insulated gate semiconductor device of FIG. 6 used as a practical circuit element has N-channel and P-channel IG-FET elements 81 and 82 and a bipolar transistor element 83 which are all formed on an N-type silicon substrate 80. The N-channel IG-FET element 81 is disposed in a first P-type island region 84 formed by diffusing impurities in the substrate 80 and consists of $N^+$-type source and drain regions 86 and 85 arranged at a prescribed space, a gate insulator 87 of silicon dioxide mounted on a P-type region 84 between the source and drain regions 86 and 85 and a gate electrode 88 deposited on the gate insulator layer 87. The P-channel IG-FET element 82 comprises $P^+$-type source and drain regions 89 and 90 provided at a prescribed space in the substrate 80, a gate insulator layer 91 formed on the substrate 80 in the same manner as in the N-channel IG-FET and a gate electrode 92. The protective transistor element 83 includes the substrate 80 as a collector region, a second P-type island region 93 formed by diffusion in the collector region and an $N^+$-type emitter region 94 formed similarly by diffusion in the island region 93, and is of NPN type planar structure, the emitter region 94 being provided with an emitter electrode 95. To the gate electrodes 88 and 92 of the N-channel and P-channel IG-FET elements 81 and 82 and the emitter electrode 95 of the bipolar transistor element 83 are electrically connected terminals 96, 97 and 98. Reference numeral 99 denotes a protective layer prepared from, for example, silicon dioxide. The manner in which these three transistors 81, 82 and 83 are connected to each other will be apparent from FIG 8. The aforementioned two P-type island regions 84 and 93 are formed by the same diffusion process, and the $N^+$-type regions 85 and 86 of the N-channel MOS-FET element 81 and the $N^+$-type region 94 of the protective transistor element 83 may be also prepared by the same diffusion process.

Figure 8A:
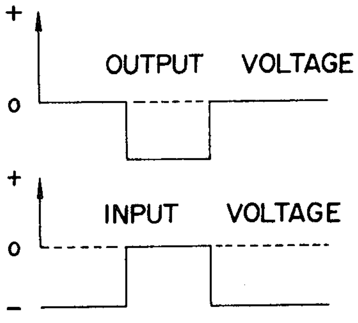
FIG. 8A is a diagram showing an input and an output voltage associated with the circuit of FIG. 8.

The IG-FET elements involved in a complementary semiconductor device of the aforementioned arrangement perform an inverter action like those of the conventional semiconductor device. Namely, in the normal operation the source region 86 is electrically connected to the first P-type island region 84 and a negative voltage is applied to the P-type island region 84 with respect to the N-type substrate 80, so that the junction between said island region 84 and the N-type substrate 80 is reverse biased, if there is applied a zero voltage to the input terminals 96 and 97, the P-channel transistor element is brought to a nonconductive state, because the gate voltage is not negative. Since the P-type region 84 has a negative potential, the input voltage of the N-channel transistor element 81 may be deemed as positive with respect to the P-type region 84. As the result, the N-channel transistor 81 is brought to a conductive state, so that the output of the inverter become a negative high voltage. Where there is applied a negative input voltage, having the same magnitude as the source voltage of the N-channel transistor 81, the P-channel transistor element 82 is brought to a conductive state and the N-channel transistor element 81 to a nonconductive state (because the input voltage may be taken as zero with respect to the island region 84), thereby producing an output voltage. Hence FIG. 8A where the output and input voltage are reversed in polarity.

Where to the input terminal 98 of the protective transistor element 83 there is applied a high positive voltage unlike the aforementioned normal operation, the PN junction of the second P-type island region 93 and the N-type substrate 80 is forward biased. In this case, however, the PN junction of the P-type island region 93 and the $N^+$-type emitter region 94 is reverse biased preventing the flow of a large current through the protective transistor 83. Accordingly, said transistor 83 is not readily subject to failure, but reliably performs a protective action. Namely, the avalanche of the emitter-base junction of said protective transistor 83 assuredly saves the gate insulatore 87 and 91 of both IG-FET elements 81 and 82 from failure.

Where to the input terminal 98 there is applied a high negative voltage, the emitter-base junction ($N^+P$ junction) of the protective transistor element 83 is forward biased, whereas the base-collector junction (PN junction) thereof is reverse biased, preventing an excess current from passing through the protective transistor element 83. Thus there is obtained the same effect as in the case where there is introduced a positive high voltage.

A complementary transistor device of the aforesaid arrangement permits the IG-FET to be prevented from failure, whether a positive or negative input voltage, is applied to the protective bipolar transistor element and also saves the protective transistor element itself from failure. Since the emitter-base junction and base-collector junction are connected in series it is possible to miniaturize the protective transistor element and in consequence reduce its capacitance and the resultant semiconductor device as a whole can be made compact, permitting a guide switching operation.

Figure 7:
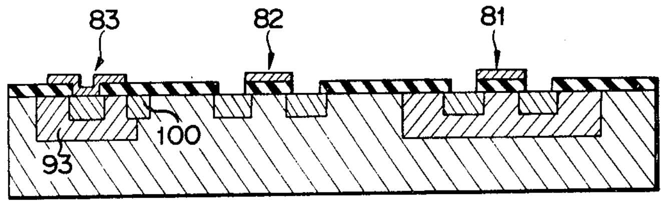
FIG. 7 is a sectional view of an improvement from the device of FIG. 6.

FIG. 7 presents an improvement from the semiconductor device of FIG. 6. According to the embodiment of FIG. 7, there is formed on the substrate 80 at the base-collector junction a $P^+$-type auxiliary region 100 containing higher concentrations of impurities than the second P-type island region 93. Up to this point, the voltage level at which the protective action starts has been defined by the avalanche voltage (generally about 100 volts) of the base-collector junction. Now due to the presence of said protective region 100, the initiation of the protective action is determined by the voltage level prevailing in the $P^+N$ junction between said auxiliary region 100 and the substrate 80. Since the avalanche breakdown voltage of the $P^+N$ junction is lower than that of the base-collector junction (PN junction), the breakdown voltage of the device of FIG. 7 is reduced to that of the $P^+N$ junction, generally down to about 40 volts.

Figure 9:
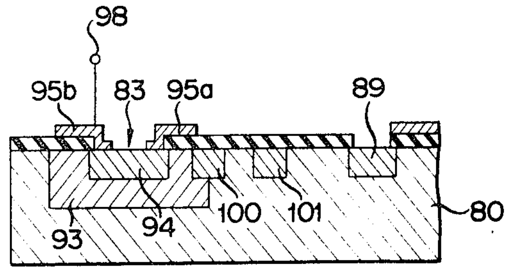
FIGS. 9 to 11 are sectional views of modifications from the device of FIG. 7.

There is now described a modification of the semiconductor device of FIG. 7, with reference to FIG. 9. On both sides of the emitter region 94 of the protective bipolar transistor 83 are formed emitter electrodes 95*a* and 95*b* at a prescribed space. To one electrode 95*b* is connected the input terminal 98 so as to use the emitter region 94 as a resistor for an increased protective effect.

On the substrate 80 is mounted another $N^+$-type auxiliary region 101 in the vicinity of the aforesaid $P^+$-type auxiliary region 100 disposed between the substrate 80 and the second P-type region 93. This arrangement is intended further to decrease the breakdown voltage of the semiconductor device by arranging the first and second auxiliary regions 100 and 101 at a proper space.

Figure 10:
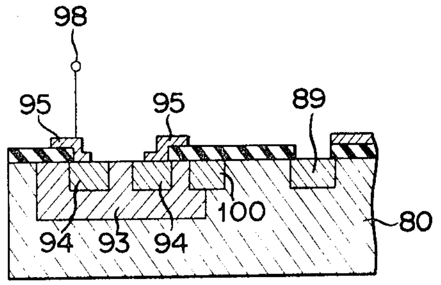

FIG. 10 illustrates still another modification. On the second island or base region 93 are formed at a prescribed space two $N^+$-type emitter regions 94 each fitted with an emitter electrode 95. From one of these emitter electrodes is led out a terminal 98.

Figure 11:
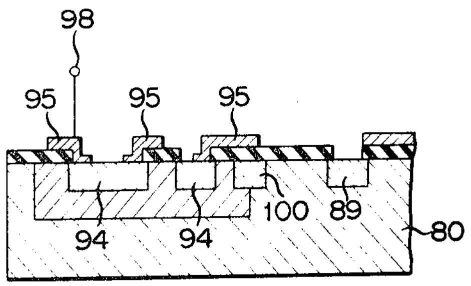

FIG. 11 shows a further modification. There are provided two emitter regions 94. One larger emitter region is fitted with two emitter electrodes 95 positioned at a proper space. The other smaller emitter region is provided with a single emitter electrode 95. From the larger emitter region is drawn out the terminal 98.

The bipolar transistor of FIGS. 10 and 11 constitutes a lateral type by two separate emitter region 94 and a base region 93. By this device the same effects as the others may be obtained.

What is claimed is:

1. A composite semiconductor device comprising:

a substrate formed of a semiconductor of an N-type;

an island region of a P-type formed in said substrate;

a first insulated gate field effect transistor having source and drain regions of an N-type separately formed in said island region;

a second insulated gate field effect transistor spaced from said first field effect transistor and having source and drain regions of a P-type separately formed in said substrate;

a bipolar transistor having emitter, base and collector regions located in said substrate, said base region being of a P-type, said emitter being of an N-type and formed in said base region, said emitter being electrically connected to said gates of said field effect transistors; and a first auxiliary semiconductor region of a P-type formed in said substrate and having an impurity concentration higher than and extending into said base region.

a second insulated gate field effect transistor spaced from said first field effect transistor and having source and drain regions of a P-type separately formed in said substrate;

* * * * *

UNITED STATES PATENT OFFICE
CERTIFICATE OF CORRECTION

PATENT NO. : 3,739,238
DATED : June 12, 1973
INVENTOR(S) : Hisashi Hara

It is certified that error appears in the above-identified patent and that said Letters Patent are hereby corrected as shown below:

Column 8, delete lines 18-21 inclusive.

Signed and Sealed this

*twenty-first* Day of *October 1975*

[SEAL]

*Attest:*

RUTH C. MASON
*Attesting Officer*

C. MARSHALL DANN
*Commissioner of Patents and Trademarks*